United States Patent [19]

Saitoh et al.

[11] Patent Number: 4,844,950
[45] Date of Patent: Jul. 4, 1989

[54] METHOD FOR FORMING A METAL FILM ON A SUBSTRATE

[75] Inventors: Keishi Saitoh, Nabari; Masaaki Hirooka, Toride; Jun-ichi Hanna; Isamu Shimizu, both of Yokohama, all of Japan

[73] Assignee: Canon Kabushiki Kaisha, Tokyo, Japan

[21] Appl. No.: 942,213

[22] Filed: Dec. 16, 1986

[30] Foreign Application Priority Data

Dec. 18, 1985 [JP] Japan ................. 60-285279

[51] Int. Cl.[4] .............. C23C 16/06; C23C 16/08; C23C 16/16
[52] U.S. Cl. ..................... 427/250; 427/252; 427/253; 427/255; 427/255.1
[58] Field of Search .......... 427/91, 250, 253, 252, 427/255, 255.1, 124

[56] References Cited

U.S. PATENT DOCUMENTS

| Re. 31,708 | 10/1984 | Gordon | 427/126.2 |
|---|---|---|---|
| 2,552,626 | 5/1951 | Fisher et al. | 201/64 |
| 3,083,550 | 4/1963 | Averbach | 427/252 |
| 3,188,230 | 6/1965 | Bakish et al. | 427/252 |
| 3,203,827 | 8/1965 | Hill | 427/252 |
| 3,218,204 | 11/1965 | Ruehrwein | 148/175 |
| 3,224,912 | 12/1965 | Ruehrwein | 148/175 |
| 3,306,768 | 2/1967 | Peterson | 117/106 |
| 3,466,191 | 9/1969 | Stinchfield et al. | 117/213 |
| 3,506,556 | 4/1970 | Illery et al. | 204/192 |
| 3,655,429 | 4/1972 | Deklerk | 117/106 |
| 3,664,866 | 5/1972 | Manasevit | 117/201 |
| 3,850,679 | 11/1974 | Sopko et al. | 117/106 |
| 3,870,558 | 3/1975 | Shimizu et al. | 117/201 |
| 3,984,587 | 10/1976 | Lipp | 427/70 |
| 4,058,430 | 11/1977 | Suntola et al. | 156/611 |
| 4,096,822 | 6/1978 | Yamawaki et al. | 118/48 |
| 4,146,657 | 3/1979 | Gordon | 427/126 |
| 4,180,596 | 12/1979 | Crowder et al. | 427/42 |
| 4,206,252 | 6/1980 | Gordon | 427/160 |
| 4,239,811 | 12/1980 | Kemlage | 427/95 |
| 4,282,267 | 8/1981 | Kuyel | 427/38 |
| 4,328,261 | 5/1982 | Heinecke et al. | 427/91 |
| 4,357,179 | 11/1982 | Adams et al. | 148/1.5 |
| 4,359,490 | 11/1982 | Lehrer | 427/95 |
| 4,402,762 | 9/1983 | John et al. | 148/1.5 |
| 4,416,217 | 11/1983 | Nakamura et al. | 118/696 |
| 4,422,407 | 12/1983 | Bessot et al. | 118/723 |
| 4,448,801 | 5/1984 | Fukuda et al. | 427/39 |
| 4,515,107 | 5/1985 | Fournier et al. | 118/718 |
| 4,522,663 | 6/1985 | Ovshinsky et al. | 148/403 |
| 4,526,809 | 7/1985 | Hall et al. | 427/74 |
| 4,529,679 | 7/1985 | Ogawa et al. | 430/84 |
| 4,554,180 | 11/1985 | Hirooka | 427/248.1 |
| 4,595,601 | 6/1986 | Horioka et al. | 427/53.1 |
| 4,615,905 | 10/1986 | Ovshinsky | 427/39 |
| 4,637,938 | 1/1987 | Lee et al. | 427/53.1 |
| 4,650,539 | 3/1987 | Irvine et al. | 156/613 |
| 4,652,463 | 3/1987 | Peters | 427/53.1 |

FOREIGN PATENT DOCUMENTS

2038086A 7/1980 United Kingdom ............ 427/255.1

Primary Examiner—Sadie Childs
Attorney, Agent, or Firm—Fitzpatrick, Cella, Harper & Scinto

[57] ABSTRACT

A method for forming a deposited film comprises introducing into a reaction space a gasifiable starting material containing a transition metal element for formation of a deposited film and a gaseous halogenic oxidizing agent having the property of oxidation action for said starting material to effect contact therebetween to thereby chemically form a plural number of precursors including precursors under excited state, and forming a metal deposited film on a substrate existing in the film forming space with the use of at least one precursor of these precursors as the feeding source for the constituent element of the deposited film.

3 Claims, 1 Drawing Sheet

METHOD FOR FORMING A METAL FILM ON A SUBSTRATE

BACKGROUND OF THE INVENTION

1. Field of the Invention

This invention relates to a method for formation of a functional film, particularly a metal deposited film which can be used as a semiconductor device, photosensitive device for electrophotography, or electrode material of an electronic device such as an optical input sensor device for an optical image inputting device, etc.

2. Related Background Art

In the prior art, individually suitable film forming methods have been adopted from the viewpoints of the physical characteristics or desired uses for metal films.

For example, as a method for forming metal films, there have been utilized the heating vacuum vapor deposition method, the electron beam vacuum vapor deposition method, the sputtering method, etc.

In semiconductor industries which have been developing remarkably in recent years, the deposition method of semiconductor films from gas phase is attracting attention. For example, A-Si:H film has been deposited from $SiH_4$ according to the PCVD method, the thermal CVD method, the optical CVD method, the HRCVD method, etc. On the other hand, GaAs films, etc. have been deposited according to the MOCVD method.

In preparation of devices (e.g., TFT, solar battery, sensor photosensitive member, for electrophotography, etc.) by use of such deposition methods of semiconductor films, when electrodes are deposited according to the method of the prior art, the semiconductor films deposited in vacuum are required to be taken out into the atmosphere, whereby oxidation and attachment of dust occur in the air to bring about deterioration in characteristics of the device.

The above problem can be eliminated by designing the semiconductor film deposition chamber and, for example, the electron beam vacuum evaporation chamber so that the sample may be transported under vacuum between those chambers. However, due to extreme difference in vacuum degree between the semiconductor film deposition chamber and the metal film evaporation chamber, a preliminary evacuation chamber is required to be provided between the deposition chamber and the evaporation chamber. For this reason, there is involved the problem that the equipment cost becomes high. Also, according to this method, due to extreme differences in vacuum degree between the deposition chamber and the vapor deposition chamber, there ensues the problem that a device's film layer (e.g. solar battery) can not be deposited continuously on a sheet-shaped substrate without difficulty.

SUMMARY OF THE INVENTION

An object of the present invention is to remove the drawbacks of the method for forming deposited films as described above and at the same time to provide a novel method for forming a deposited film of a metal without use of the formation method of the prior art.

Another object of the present invention is to provide a method for forming a deposited film capable of effecting energy saving an at the same time obtaining a deposited film with uniform characteristics over a large area with easy management of film quality.

Still another object of the present invention is to provide a method for forming a deposited film by which a metal film excellent in productivity and bulk productivity, having high quality as well as excellent physical characteristics such as electrical and optical characteristics can be easily obtained.

According to the present invention, there is provided a method for forming a deposited film comprising introducing into a reaction space a gasifiable starting material containing a transition metal element for formation of a deposited film and a gaseous halogenic oxidizing agent having the property of oxidation action on said starting material to effect contact therebetween to thereby chemically form a plural number of precursors including precursors under excited state, and forming a metal deposited film on a substrate existing in the film forming space with the use of at least one precursor of these precursors as the feeding source for the constituent element of the deposited film.

DETAILED DESCRIPTION OF THE PREFERRED EMBODIMENTS

Figure 1:
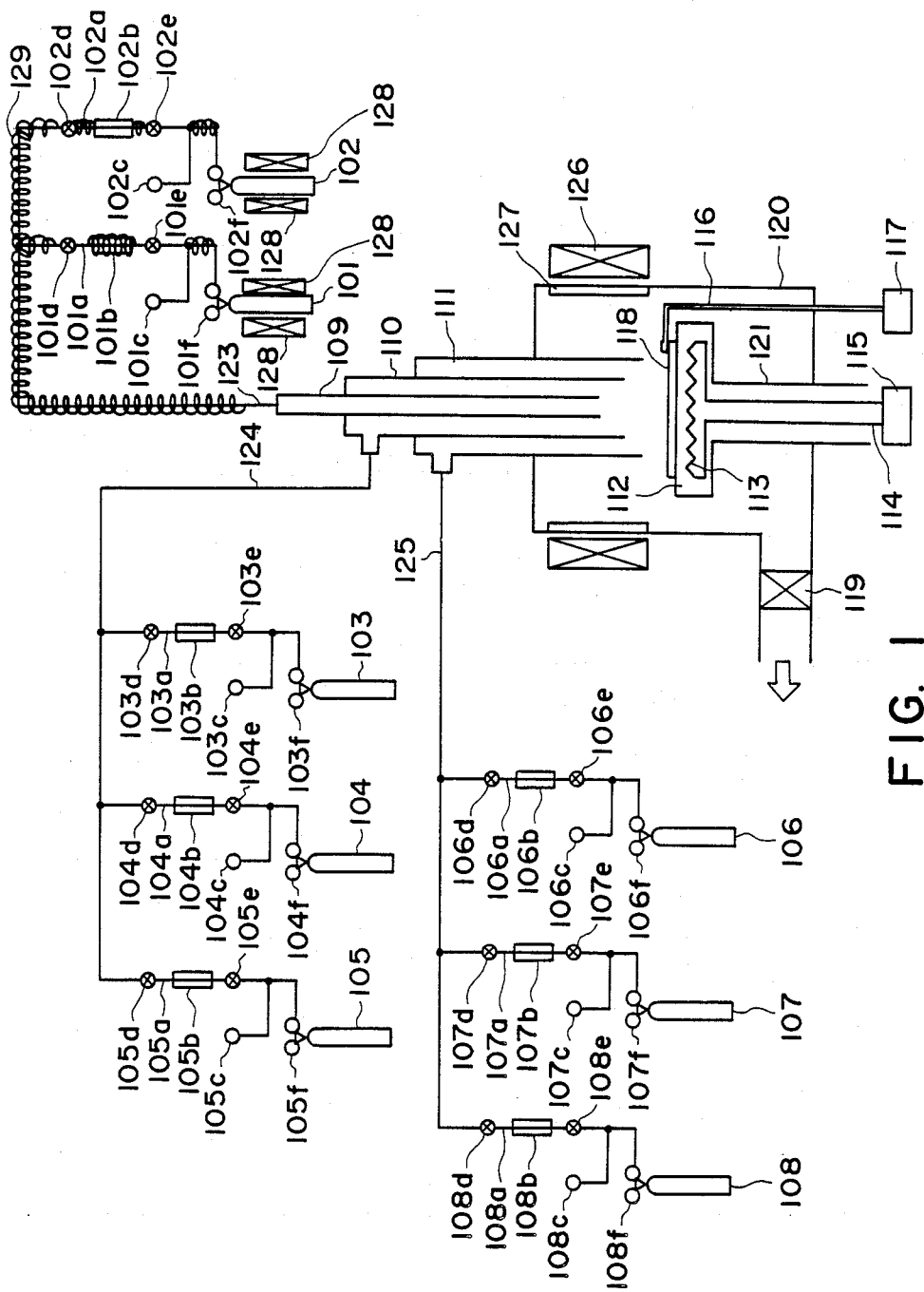
FIG. 1 is a schematic illustration of a film forming device used in Examples of the present invention.

According to the method for forming a deposited film of the present invention as described above, simplification of management and bulk production can be effected with full satisfaction of enlargement of area, uniformity of film thickness and uniformity of film quality as well as with conservation of energy, without requiring enormous installation investment for bulk production apparatus, and also easier management of a broader range of parameters and a more easily controlled device.

In the method for forming a metal film of the present invention, the gaseous starting material to be used for formation of a metal film receives oxidizing action through chemical contact with a gaseous halogenic oxidizing agent and can be selected suitably as desired depending on the kind, the characteristic, use, etc., of the desired deposited film. In the present invention, the above gaseous starting material and the gaseous halogenic oxidizing agent may be those which can be made gaseous prior to the chemical reaction, and they may be gas, liquid or solid as ordinary state.

When the starting material for formation of a deposited film or a halogenic oxidizing agent is liquid or solid, the starting material for formation of a deposited film and the halogenic oxidizing agent are introduced in a gaseous state into the reaction space through the use of bubbling it with the a carrier gas such as Ar, He, $N_2$, $H_2$, etc., optionally with application of heat.

During this operation, the partial pressures and mixing ratio of the above gaseous starting material and the gaseous halogenic oxidizing agent may be set by controlling the flow rate of the carrier gas and the vapor pressures of the starting material for formation of the deposited film and the gaseous halogenic oxidizing agent.

As the gasifiable starting material containing a transition metal element to be used in the present invention, the following compounds may be employed.

Examples of compounds containing Cr may include halides and organic chromium compounds such as $CrBr_3$, $Cr(CO)_6$, $Cr(CO)_5$, $\{P(C_6H_5)_3\}$, $Cr(CO)_3(C_6H_6)$, $CrH(CO)_3(C_5H_5)$, $Cr_2(CO)_6$, $(C_5H_5)_2$, $Cr(C_6H_6)_2$, $Cr(C_5H_5)_2$, $Cr(CH_3)_4$, etc.

Examples of compounds containing Fe may include halides and organic iron compounds such as $FeCl_2$, $FeCl_3$, $FeBr_3$, $Fe_3(CO)_{12}$, $Fe(C_5H_5)_2$, $Fe(C_5H_5)(CH_3COC_5H_4)$, $Fe(C_5H_5)(C_5H_4CHO)$, $Fe(C_5H_5)(CH_2=CHC_5H_4)$, $Fe(C_9H_7)_2$, etc.

Examples of compounds containing Mn may include halides and organic manganese compounds such as $Mn(C_5H_7O_2)_2$, $MnBr(CO)_5$, $Mn(CH_3)(CO)_5$, $Mn(CO)_4(C_3H_5)Mn(CO)_3(C_5H_5)$, $Mn(C_5H_5)_2$, etc.

Examples of compounds containing Mo halides and organic molybdenum compounds such as $MoCl_3O$, $Mo_{12}Cl_5O_3$, $MoCl_4O$, $MoCl_2O_2$, $Mo_2(CH_3COO)$, $MO(CO)_6$, $MoH_2(C_5H_5)_2$, $MoCl_5$, etc.

Examples of compounds containing Ta may include halides and organic tantalum compounds such as $TaCl_5$, $TaBr_5$, $TaCl_2(C_5H_5)_2$, $TaH_3(C_5H_5)_2$, etc.

Examples of compounds containing V may include halides and organic vanadium compounds such as $VCl_3$, $VCl_4$, $VBr_2$, $VF_3O$, $VCl_3O$, $VBr_3O$, $V(CO)_6$, $V(CO)_4(C_5H_5)$, $V(C_5H_5)_2$, $VCl(C_5H_5)_2$, $V(C_6H_6)_2$, etc.

Examples of compounds containing Au may include halides and organic gold compounds such as $AuCl_3$, $Au(CH_3)_3$, $AuBr(CH_3)_2$, etc.

Examples of compounds containing Pt may include halides and organic platinum compounds such as trans-$[PtI(CH_3)\{P(C_2H_5)_3\}_2]$, Cis-$[Pt(C_6H_5)_2\{P(C_2H_5)_3\}_2]$, trans-$[Pt(C_5H_5)_2\{P(C_2H_5)_3\}_2]$, Cis-$[PtCl_2(C_6H_5NC)\{P(C_2H_5)_3\}]$, $Pt(C_2H_4)_3$, $Pt(C_2H_4)\{P(C_6H_5)_3\}_2$, $Pt(C_3H_5)_2$, $Pt(C_2H_4)_3$, etc.

Of course, these starting materials can be used not only as one kind but also as a mixture of two or more kinds.

The halogenic oxidizing agent to be used in the present invention is gaseous when introduced into the reaction space and at the same time has the property of effectively oxidizing the gaseous starting material for formation of a deposited film introduced into the reaction space by mere chemical contact therewith, including halogenic gas such as $F_2$, $Cl_2$, $Br_2$, $I_2$, etc., and fluorine, chlorine, bromine, etc., under nascent state as effective ones.

These halogenic oxidizing agents are introduced into the reaction space under gaseous state together with the gas of the starting material for formation of a deposited film as described above with desired flow rate and feeding pressure, wherein they are mixed with and collided against the above starting material to be chemically contacted therewith, thereby oxidizing the above starting material to generate efficiently plural kinds of precursors including precursors under excited state. Of the precursors under excited state and other precursors generated, at least one of them function as the feeding source for the constituent element of the deposited film formed.

The precursors generated may undergo decomposition or reaction to be converted to other precursors under excited state or to precursors under another excited state, or alternatively in their original forms, if desired, although releasing energy to contact the substrate surface arranged in a film forming space, whereby a deposited film with a three-dimensional network structure is formed.

In the present invention, so that the deposit film forming process may proceed smoothly to form a film of high quality and having desired physical characteristics, as the film forming factors, the kinds and combination of the starting material and the halogenic oxidizing agent, mixing ratio of the two, pressure during mixing, flow rate, the inner pressure in the film forming space, the flow types of the gases, the film forming temperature (substrate temperature and atmosphere temperature) are suitably selected as desired. These film forming factors are organically related to each other, and they are not determined individually but determined respectively under mutual relationships. In the present invention, the ratio of the gaseous starting material for formation of a deposited film and the gaseous halogenic oxidizing agent introduced into the reaction space may be determined suitably as desired in relationship of the film forming factors mentioned above, but it is preferably 1/20 to 100/1, more preferably 1/5–50/1 in terms of flow rate ratio introduced.

The pressure during mixing when introduced into the reaction space may be preferably higher in order to enhance the probability of chemical contact between the above gaseous starting material and the above gaseous halogenic oxidizing agent in probability, but it is better to determine the optimum value suitably as desired in view of their reactivity. Although the pressure during mixing may be determined as described above, each of the pressures during introduction may be preferably $1 \times 10^{-7}$ atm to 10 atm, more preferably $1 \times 10^{-6}$ atm to 3 atm.

The pressure within the film forming space, namely the pressure in the space in which the substrate on which surface is effected film formation, is arranged so that the precursors (E) under excited state generated in the reaction space and sometimes the precursors (D) formed as secondary products from said precursors (E) may contribute effectively to film formation.

The inner pressure in the film forming space, when the film forming space is continuous openly to the reaction space, can be controlled in relationship to the introduction pressures and flow rates of the gaseous starting material for formation of a deposited film and the gaseous halogenic oxidizing agent in the reaction space, for example, by application of a contrivance such as differential evacuation or use of a large scale evacuating device.

Alternatively, when the conductance at the connecting portion between the reaction space and the film forming space is small, the pressure in the film forming space can be controlled by providing an appropriate evacuating device in the film forming space and controlling the evacuation amount of said device.

On the other hand, when the reaction space and the film forming space are integrally made and the reaction position and the film forming position are only different in space, it is possible to effect differential evacuation or provide a large scale evacuating device having sufficient evacuating capacity as described above.

As described above, the pressure in the film forming space may be determined in relationship with the introduction pressures of the gaseous starting material and the gaseous halogenic oxidizing agent introduced into the reaction space, but it is preferably 0.001 Torr to 100 Torr, more preferably 0.01 Torr to 30 Torr, optimally 0.05 to 10 Torr.

As for the flow type of the gases, it is necessary to design the flow type in view of the geometric arrangement of the gas introducing inlet, the substrate and the gas evacuating outlet so that the starting material for formation of a deposited film and the halogenic oxidizing agent may be uniformly and efficiently mixed during introduction of them into the reaction space, the above precursors (E) may be efficiently generated and film formation may be adequately done without trouble. A preferable example of the geometric arrangement is shown in FIG. 1.

As the substrate temperature (Ts) during film formation, it can be set suitably as desired depending on the individual gas species employed and the kinds and the required characteristics of the deposited film formed, but, in the case of obtaining an amorphous film, it is preferably from room temperature to 900° C., more preferably from 50° to 700° C.

As the atmosphere temperature (Tat) in the film forming space, it may be determined suitably as desired in relationship with the substrate temperature (Ts) so that the above precursors (E) generated and the above precursors (D) may not changed to unsuitable chemical species for film formation, and also the above precursors (E) may be efficiently generated.

The substrate to be used in the present invention may be either electroconductive or electrically insulating, provided that it is selected as desired depending on the use of the deposited film formed. As the electroconductive substrate, there may be mentioned metals such as NiCr, stainless steel, Al, Cr, Mo, Au, Ir, In, Nb, Ta, V, Ti, Pt, Pd etc. or alloys thereof.

As electrically insulating substrates, there may be conventionally used films or sheets of synthetic resions, including polyester, polyethylene, polycarbonate, cellulose acetate, polypropylene, polyvinyl chloride, polyvinylidene chloride, polystyrene, polyamide, etc., glasses, ceramics, papers and so on. The substrate may be shaped in any form such as cylinders, belts, plates or others, and its form may be determined as desired.

The substrate should be preferably selected from among those set forth above in view of adhesion and reactivity between the substrate and the film. Further, if the difference in thermal expansion property between both is great, a large amount of strains may be created within the film which sometimes results in a film of inferior quality, and therefore it is preferable to use a substrate so that the difference in thermal expansion property between both is small.

Also, the surface state of the substrate is directly related to the structure of the film (orientation) or generation of stylet structures, and therefore it is desirable to treat the surface of the substrate to give a film structure and a film texture so that desired characteristics may be obtained.

FIG. 1 shows an example of a preferable device for practicing the method for forming a deposited film of the present invention.

The deposited film forming device shown in FIG. 1 is broadly classified into the three of a main device, an evacuation system and a gas feeding system.

In the main device, a reaction space and a film forming space are provided.

101-108 are respectively bombs filled with the gases and the compounds containing transition metal elements to be used during film formation, 101a-108a are respectively gas feeding pipes, 101b-108b are respectively mass flow controllers for controlling the flow rates of the gases from the respective bombs, 101c-108c are respectively gas pressure gauges, 101d-108d and 101e-108e are respectively valves, and 101f-108f are respectively pressure gauges indicating the pressures in the corresponding gas bombs.

120 is a vacuum chamber equipped at the upper portion with a pipeline for gas introduction, having a structure for formation of the reaction space downstream of the pipeline, and also having a structure for formation of a film forming space in which a substrate holder 112 is provided so that a substrate 118 may be provided as opposed to the gas discharging outlet of said pipeline. The pipeline for gas introduction has a triple concentric arrangement structure, having from the innerside a first gas introducing pipe 109 for introducing the gases containing transition metal gasified by the heater 128 from the gas bombs 101, 102, a second gas introducing pipe 110 for introducing the gases from the gas bombs 103-105, and a third gas introducing pipe 111 for introducing the gases from the gas bombs 106-108.

For gas evacuation to the reaction space of each gas introducing pipe, its position is designed so as to be arranged at a position farther from the surface position of the substrate as the pipe is nearer to the inner side. In other words, the respective gas introducing pipes are arranged so that the pipe on the outer side may enclose the pipe existing within the innerside thereof.

The gases from the respective bombs are fed into the respective introducing pipes through the gas feeding pipelines 123-125, respectively.

The respective gas introducing pipes, the respective gas feeding pipelines and the vacuum chamber 120 are evacuated to vacuum through the main vacuum valve 119 by means of a vacuum evacuating device not shown.

The substrate 118 is set by a suitable desired distance from the positions of the respective gas introducing pipes by moving vertically the substrate holder 112.

In the present invention, the distance between the substrate and the gas discharging outlet of the gas introducing pipe may be determined appropriately in view of the kinds and the desired characteristics of the deposited film formed, the gas flow rates, the inner pressure of the vacuum chamber, etc., but it is preferably several mm to 20 cm, more preferably 5 mm to about 15 cm.

113 is a heater for heating the substrate, which is provided in order to heat the substrate to an appropriate temperature during film formation, or to preheat the substrate 118 before film formation, or further to anneal the film after film formation.

The substrate heating heater 113 is supplied with power through a conductive wire 114 from a power source 115.

116 is a thermocouple for measuring the temperature of the substrate (Ts) and is electrically connected to the temperature display device 117.

The present invention is described more in detail by referring to the following Examples.

EXAMPLE 1

By use of the film forming device shown in FIG. 1, a Mo metal film was deposited under the conditions of Example 1 in Table 1.

A metal film was formed by operating the film forming device according to the following procedure. By heating the bomb 101 to 300° C. by the heater 128, $MoCl_5$ filled in the bomb 101 was gasified and introduced at a flow rate of 20 sccm through the gas introducing pipe 109 into the vacuum chamber 120. Similarly, $F_2$ gas filled in the bomb 106 was introduced at a flow rate of 20 sccm, and He gas filled in the bomb 107 at a flow rate of 40 sccm through the gas introducing pipe 111 into the vacuum chamber 120.

During this operation, the pressure in the vacuum chamber 120 was made 800 mTorr by controlling the opening of the vacuum valve 119. A quartz glass (15 cm×15 cm) was used for the substrate, and the distance between the gas introducing inlet 111 and the substrate was set at 3 cm. The substrate temperature was set at 300° C.

When gases were permitted to flow under such conditions for 3 hours, a Mo film with a thickness as shown in Table 1 was deposited on the substrate.

The distribution irregularity of the film thickness was within ±5%. The film was found to have the electrical characteristics as shown in Example 1 in Table 1.

EXAMPLES 2–10

By means of the film forming device shown in FIG. 1, under the conditions stated in Table 1, Example 2 to Table 4, Example 10, metal films were deposited according to the same operation and procedure as in Example 1, respectively.

The respective metal films obtained were found to have the electrical properties as shown in Table 1, Example 2 to Table 4, Example 10.

TABLE 1

| Example | Starting material gas | Flow rate (sccm) | Inner pressure (Torr) | Substrate temperature (°C.) | Film thickness (μm) | Resistance value (Ωcm) |
| --- | --- | --- | --- | --- | --- | --- |
| 1 | $F_2$ | 200 | 0.8 | 300 | 0.1 | $10^{-2}$ |
|   | He | 100 | | | | |
|   | $MoCl_5$ | 20 | | | | |
| 2 | $F_2$ | 30 | 0.7 | 200 | 0.1 | $2 \times 10^{-3}$ |
|   | He | 100 | | | | |
|   | $Mn(C_5H_5)_2$ | 30 | | | | |
| 3 | $F_2$ | 40 | 0.65 | 200 | 0.1 | $10^{-2}$ |
|   | He | 200 | | | | |
|   | $Mn(C_5H_7O_2)_2$ | 40 | | | | |

TABLE 2

| Example | Starting material gas | Flow rate (sccm) | Inner pressure (Torr) | Substrate temperature (°C.) | Film thickness (μm) | Resistance value (Ωcm) |
| --- | --- | --- | --- | --- | --- | --- |
| 4 | $F_2$ | 20 | 0.7 | 100 | 0.1 | $2 \times 10^{-4}$ |
|   | He | 100 | | | | |
|   | $Pt(C_2H_4)_3$ | | | | | |
| 5 | $F_2$ | 20 | 0.6 | 200 | 0.1 | $3 \times 10^{-5}$ |
|   | He | 100 | | | | |
|   | $AuCl_3$ | 20 | | | | |
| 6 | $F_2$ | 30 | 0.5 | 100 | 0.1 | $1 \times 10^{-4}$ |
|   | He | 200 | | | | |
|   | $CrBr_3$ | 30 | | | | |

TABLE 3

| Example | Starting material gas | Flow rate (sccm) | Inner pressure (Torr) | Substrate temperature (°C.) | Film thickness (μm) | Resistance value (Ωcm) |
| --- | --- | --- | --- | --- | --- | --- |
| 7 | $F_2$ | 20 | 0.5 | 100 | 0.1 | $10^{-5}$ |
|   | He | 100 | | | | |
|   | $FeBr_3$ | 20 | | | | |
| 8 | $F_2$ | 20 | 0.2 | 300 | 0.1 | $10^{-5}$ |
|   | He | 100 | | | | |
|   | $TaCl_5$ | 20 | | | | |

TABLE 4

| Example | Starting material gas | Flow rate (sccm) | Inner pressure (Torr) | Substrate temperature (°C.) | Film thickness (μm) | Resistance value (Ωcm) |
| --- | --- | --- | --- | --- | --- | --- |
| 9 | $F_2$ | 10 | 0.2 | 100 | 0.1 | $10^{-4}$ |
|   | He | 100 | | | | |
|   | $V(CO)$ | 20 | | | | |
| 10 | $F_2$ | 10 | 0.2 | 300 | 0.1 | $10^{-4}$ |
|   | He | 100 | | | | |
|   | $V(C_6H_6)_2$ | 10 | | | | |

As can be seen from the detailed description and the respective examples as set forth above, according to the deposition film forming method of the present invention, deposited films having uniform physical properties over a large area can be obtained with easy management of film quality simultaneously with achievement of energy saving. Also, it is possible to obtain easily films excellent in productivity, bulk productivity, having high quality and excellent physical properties such as electrical, optical and semiconductor properties, etc.

We claim:

1. A method for forming a metal deposited film on a substrate in a film forming space, which comprises:
    introducing into a reaction space a gaseous or gasifiable starting material containing a transition metal element for formation of said metal film and fluorine as a gaseous halogenic oxidizing agent having the property of oxidation action on said starting material for formation of said metal film;
    forming a mixture to effect chemical contact between said starting material and said fluorine through a gas introducing conduit system and thereby chemically producing a plural number of precursors including precursors in an excited state, said gas introducing conduit system including a plurality of coaxially aligned conduits each having an exit orifice with an outer conduit adapted to carry said fluorine and at least one inner conduit adapted to carry the starting material, said coaxially aligned conduits extending into said reaction space such that the exit orifice of said at least one inner conduit is set back from the exit orifice of the outer conduit to enable the fluorine in the outer conduit to surround the starting material exiting said at least one inner conduit, said substrate positioned form 5 mm. to 15 cm. from the exit orifice of said outer conduit; and
    depositing said metal film on said substrate including at least one of said precursors as the feeding source for the constituent element of the film.

2. The method according to claim 1, wherein the transition metal element contained in said starting material is V, Cr, Mn, Fe, Ta, Pt, Au, Mo.

3. The method according to claim 1, wherein said substrate is arranged at a position opposed to the direction in which said gaseous starting material and said fluorine are introduced into said reaction space.

* * * * *

UNITED STATES PATENT AND TRADEMARK OFFICE
CERTIFICATE OF CORRECTION

PATENT NO. : 4,844,950

DATED : July 4, 1989

INVENTOR(S) : KEISHI SAITOH, ET AL.

It is certified that error appears in the above-identified patent and that said Letters Patent is hereby corrected as shown below:

COLUMN 1

Line 36, "in vacuum" should read --in a vacuum--.
    Line 66, "an" should read --and--.

COLUMN 2

Line 54, "the" should be deleted.

COLUMN 4

Line 21, "in probability" should be deleted.

COLUMN 5

Line 17, "not changed" should read --not be changed--.

COLUMN 8

Line 29, "obtain easily" should read --easily obtain--.
    Line 56, "form 5 mm." should read --from 5 mm.--.

Signed and Sealed this

Fourth Day of September, 1990

Attest:

HARRY F. MANBECK, JR.

*Attesting Officer*        *Commissioner of Patents and Trademarks*